United States Patent [19]

Fukuda et al.

[11] 4,456,971
[45] Jun. 26, 1984

[54] SEMICONDUCTOR RAM THAT IS ACCESSIBLE IN MAGNETIC DISC STORAGE FORMAT

[75] Inventors: Joji Fukuda, Yokohama; Yutaka Okubo, Atsugi, both of Japan

[73] Assignee: Sony Corporation, Tokyo, Japan

[21] Appl. No.: 345,640

[22] Filed: Feb. 4, 1982

[30] Foreign Application Priority Data

Feb. 9, 1981 [JP] Japan .................. 56-17742

[51] Int. Cl.³ ............................................. G06F 13/06
[52] U.S. Cl. ............................................. 364/900
[58] Field of Search ... 364/200 MS File, 900 MS File

[56] References Cited

U.S. PATENT DOCUMENTS 4,333,089 6/1982 Leininger ..................... 364/200 X Primary Examiner—Raulfe B. Zache
Attorney, Agent, or Firm—Lewis H. Eslinger; Alvin Sinderbrand

[57] ABSTRACT

A semiconductor random access memory system for use in a processor system is adapted to operate with a magnetic disc storage device, such as the so-called floppy-disc store. A semiconductor RAM has data input/output terminals and address terminals for writing data into or reading data out of a storage location that is addressed by an address signal supplied to the address terminals. Track and sector address registers are coupled to the processor system for receiving and storing the typical track and sector address signals normally generated in the system. A counter counts timing pulses to produce a changing count signal, which timing pulses are generated by a timing control circuit. An address synthesizer is coupled to the track and sector address registers and also to the counter for synthesizing a RAM address signal from the stored track and sector address signals as well as the count signal and for supplying this RAM address signal to the RAM address terminals to access the RAM storage location which is addressed thereby. Thus, when the processor system generates the typical track and sector address signals normally used with a floppy disc store, such track and sector address signals are used to address a typical semiconductor RAM.

17 Claims, 1 Drawing Figure

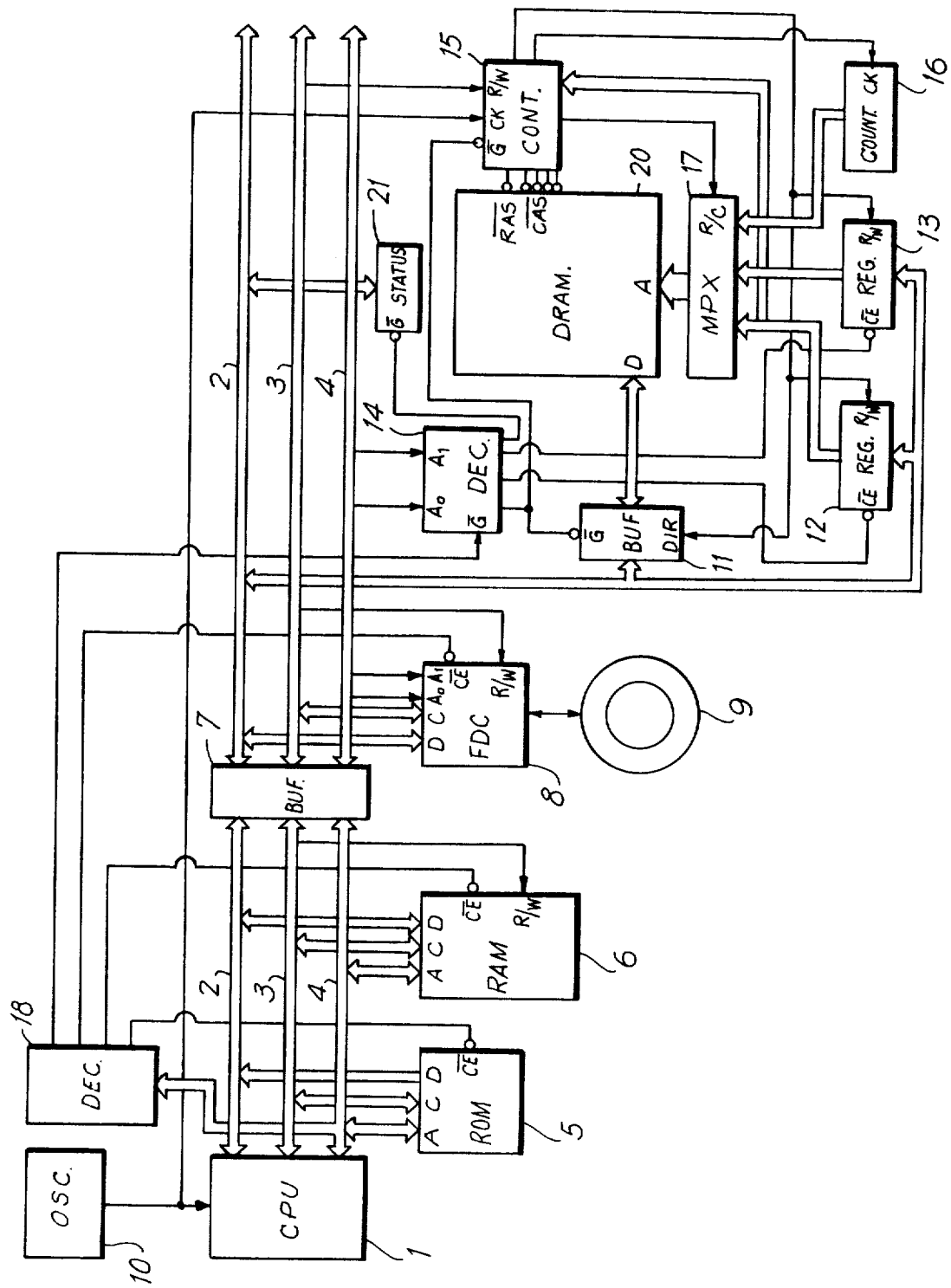

SEMICONDUCTOR RAM THAT IS ACCESSIBLE IN MAGNETIC DISC STORAGE FORMAT

BACKGROUND OF THE INVENTION

This invention relates to a semiconductor memory device for use in a processor system and, more particularly, to a semiconductor random access memory which may be accessed in accordance with the same format that the processor system normally uses when connected to a magnetic disc storage device, such as a floppy-disc store.

In a typical processor system, such as a microcomputer system, a central processing unit (CPU) is coupled to a read only memory (ROM) in which the controlling program, or software, is stored, and also to a random access memory (RAM) in which incoming and outgoing data signals, as well as other processed signals, are stored; and the processor system also is coupled to other peripheral devices. Incoming data from some of the peripheral devices are supplied to the processor system by means of an input/output (I/O) interface. Such data, which passes through the I/O interface, may be written directly into suitably accessed storage locations of the RAM under the control of the CPU, or may be processed before being stored. Processed data that is stored in the RAM subsequently may be supplied to the I/O interface, either through or under control of the CPU, and thence from the I/O interface to the appropriate peripheral device. The reception of data from the I/O interface, the writing of data into the RAM, the reading, or fetching, of data from the RAM, and the transmission of data through the I/O interface to the peripheral devices all may be controlled by the appropriate program that is stored in the ROM.

A typical CPU which may be used in processor systems of the aforenoted general type are microprocessors. Typically, an 8-bit microprocessor is provided with a 16-bit address bus, thus permitting the microprocessor to select $2^{16}$ separate address locations. In present-day nomenclature, a 16-bit address thus permits the microprocessor to be used with a memory device having 64K addressable locations. If each location is capable of storing a byte of information, the typical 8-bit microprocessor, such as the Zilog Model Z80, may be coupled to a memory device capable of storing 64K bytes. In view of the capability of most microprocessors, such a memory capacity tends to limit the "power", or data storage capacity of a typical 8-bit microprocessor. Because of this constraint, the processor system cannot handle a large quantity of data.

In view of this restriction on the power of a processor system, various techniques have been proposed by which the memory capacity of the processor system can be enlarged. In one technique, the memory device is formed of a "bank" of solid-state storage devices, such as a bank of RAMs. Individual ones, or sets, of the bank of RAMs are accessed for data write-in and read-out operations under the control of the microprocessor program. However, when a typical microprocessor, such as the aforementioned Zilog Model Z80, is used with a memory bank of the aforementioned type, special software must be designed by which a microprocessor is particularly programmed so as to function compatibly with the memory bank. For example, a special sub-program by which the memory bank addresses may be selected must be provided. In addition, the interconnections, or hardware wiring connections, must be specially "tailored" for the particular microprocessor with which the memory bank is used. Thus, when a processor system uses a memory bank to enlarge its memory capacity, the specific software and re-wiring thereof adds substantially to the expense of the overall system.

Another technique which has been used for enlarging the memory capacity of a processor system of the aforenoted type is the addition of a magnetic disc system. A typical magnetic disc device which now enjoys widespread use is the so-called floppy-disc store. In a typical floppy disc, having an 8-inch diameter, 77 separate circumferential tracks are provided, each track being divided into 26 adjacent sectors. Typically, each sector is capable of storing 128 bytes of data. Hence, the memory capacity of a typical 8-inch floppy disc is on the order of 250K bytes.

The use of floppy discs to enlarge the memory capacity of a processor system has resulted in "standard" programs, or software, for the various microprocessors used in such systems, by which a floppy disc controller (FDC) is specially controlled to access sectors and tracks in which data is stored and read. In general, the floppy disc controller is connected between the floppy disc and an I/O interface. Data thus may be stored on the floppy disc directly from the I/O interface, or this data may be supplied to the floppy disc for storage therein from the I/O interface through the CPU. Data then may be transmitted to the I/O interface from the floppy disc through substantially similar paths.

Most microprocessors that are programed for use with floppy disc stores generate a disc enable command which is transmitted to the floppy disc controller by way of the usual address bus of the processor system. This signal enables the floppy disc controller to access the floppy disc itself, whereby data may be written into or read from the disc. In addition to the disc enable command, track and sector address signals are supplied by the CPU to the floppy disc controller. These signals usually are transmitted on the 8-bit data bus of the processor system. Such address signals are used by the floppy disc controller to select, or access, the appropriate track and sector therein, whereby 128 bytes of data may be written into or read from the addressed sector. As also is typical in a processor system that is used with a floppy disc store, the CPU transmits a read/write control signal over the control bus that normally is provided in the system.

When the appropriate sector is addressed, the magnetic head of the floppy disc system is driven to the addressed track and, when the addressed sector rotates adjacent the head, data is written onto or read from that sector, depending upon the read/write command signal.

Although floppy disc systems of the aforementioned type are advantageous in that a relatively large amount of data may be stored relatively easily, and the software needed to control and access the floppy disc is not overly complicated, the fact that the floppy disc system requires mechanical elements to access, read and write data results in an inherent limitation on the speed at which desired storage locations may be addressed and data may be stored therein or read therefrom. Consequently, the overall access time, which is dependent primarily on the mechanical delays of a floppy disc system, is relatively large; especially when this access time is compared to the overall access time of a typical semiconductor RAM.

One purpose of the present invention is to utilize a semiconductor RAM to function as a "quasi-floppy disc". Because of advances which have been made in semiconductor manufacturing technology, the cost of a semiconductor memory device has been substantially reduced; and it is anticipated that the costs of semiconductor RAMs will continue to decrease in the future. This is particularly true of dynamic RAM devices, so that a semiconductor RAM system can be constructed of plural dynamic RAM sections.

OBJECTS OF THE INVENTION

Therefore, it is an object of the present invention to provide a memory system for use in a processor system which overcomes the aforenoted drawbacks of magnetic disc devices.

Another object of this invention is to provide a semiconductor RAM system which may be accessed for data storage by the same format that normally is used to access a magnetic disc device, such as a floppy disc store.

A further object of this invention is to provide a semiconductor RAM system which functions as a quasi-floppy disc device.

An additional object of this invention is to provide a memory device for a processor system which is relatively inexpensive, exhibits a high memory capacity, and is accessible at a rate up to one hundred times the access speed of a typical floppy disc device.

Yet another object of this invention is to provide a semiconductor RAM system which is connected to a processor system and is used therewith in substantially the same manner as a floppy disc store would be used.

Various other objects, advantages and features of the present invention will become readily apparent from the ensuing detailed description, and the novel features will be particularly pointed out in the appended claims.

SUMMARY OF THE INVENTION

In accordance with this invention, a semiconductor random access memory system is provided for use in a processor system of the type that normally is used with a magnetic disc store. A semiconductor RAM has data input/output terminals and address terminals for writing data into or reading data out of a storage location that is addressed by an address signal supplied to the address terminals. Track and sector address registers are provided for storing the track and sector address signals normally generated by the processor system when used with a magnetic disc storage device. A counter also is provided for counting timing pulses to produce a changing count signal; the timing pulses being generated by a timing control circuit. An address synthesizer is coupled to the track and sector address registers and also to the counter for synthesizing a RAM address signal from the stored track and address signals and from the count signal; this synthesized RAM address signal being supplied to the RAM address terminals to access the RAM storage location thus addressed thereby.

BRIEF DESCRIPTION OF THE DRAWING

The following detailed description, given by way of example, will best be understood in conjunction with the accompanying drawing in which the FIGURE is a block diagram of the semiconductor RAM system of the present invention, shown in connection with a typical processor system.

DETAILED DESCRIPTION OF THE PREFERRED EMBODIMENT

Referring now to the drawing, there is illustrated a simplified architecture, or system interconnection, for a typical processor system comprised of a CPU 1, a bi-directional data buffer register 7, a ROM 5, a RAM 6 and a floppy disc controller 8. As is conventional, the system components are interconnected by a data bus 2, such as an 8-bit data bus, a control bus 3 and an address bus 4, the latter being, for example, a 16-bit address bus. Buses 2, 3 and 4 are coupled to each of CPU 1, ROM 5, RAM 6, data buffer 7 and floppy disc controller 8. In addition, although not illustrated herein, peripheral devices may be coupled to, for example, data bus 2 via an I/O interface, this interface also being coupled to the respective data, control and address buses.

In addition to the foregoing elements, an oscillator 10 is provided for generating a system clock, this oscillator being coupled to CPU 1. Furthermore, a decoder 18 is coupled to address bus 4 and is adapted to decode the address signals which appear on the address bus to produce various enable signals, which also are referred to as "chip enable" or "chip select" signals. If each elements is constructed as one or more separate semiconductor "chips", then the particular chip enable signal which is produced by decoder 18 in response to decoded address signals supplied thereto enables a corresponding one (or more) of the chips which constitute the enabled element. ROM 5 and RAM 6 each include an enable input coupled, via respective leads, to decoder 18 to receive corresponding chip enable signals when the ROM or RAM is to be enabled.

As is conventional, ROM 5 stores the usual program information which is used to control the operation of CPU 1 and, in addition, to control the overall operation of the illustrated processor system. As one example, CPU 1 may comprise the Zilog Model Z80 CPU, and ROM 5 and RAM 6 may be conventional semiconductor memory devices which are normally used and interconnected with the Zilog Model Z80 CPU.

As mentioned above, the typical microprocessor which constitutes CPU 1 exhibits constraints on the number of addressable locations that may be accessed thereby. Typically, for a 16-bit address, CPU 1 may be used with a semiconductor RAM having a memory capacity of 64 K bytes. Accordingly, to enlarge the memory capacity of the illustrated processor system, a magnetic disc is used therewith. In the illustrated embodiment, the magnetic disc is formed of a floppy disc store 9, and floppy disc 9 is coupled to floppy disc controller 8. In conventional manner, floppy disc controller 8 responds to track and sector address signals generated by, or under control of, CPU 1 to access an addressed sector in a particular track for writing data onto or reading data from the addressed sector. Read/write control signals are supplied on control bus 3 and utilized by floppy disc controller 8 to control the read or write operation. As illustrated, floppy disc controller 8 includes a read/write (R/W) terminal coupled to control bus 3 to receive the read/write control signal. Also, the floppy disc controller includes an enable terminal coupled to decoder 18 to receive a chip enable signal when CPU 1 selects floppy disc 9 for a data write or read operation.

The manner in which CPU 1, together with ROM 5 and RAM 6, cooperates with floppy disc controller 8 to write data onto or read data from floppy disc 9 is well known to those of ordinary skill in the art. Hence, further detailed description thereof is not provided.

In addition to floppy disc controller 8 and floppy disc store 9, or in place thereof, the present invention includes a random access memory (RAM) 20 which, as will be described, functions in response to the same address and control signals as floppy disc controller 8 to store data in addressed locations. That is, data is written into or read from locations in RAM 20 that are addressed by the typical track and sector address signals that normally are used to address floppy disc 9.

In its preferred embodiment, RAM 20 is comprised of a semiconductor dynamic random access memory device, which may be of conventional construction. Alternatively, RAM 20 may comprise a typical static RAM; but, as is known, a dynamic RAM is capable of storing more information at a lower cost than a static RAM. As one example, a conventional semiconductor dynamic random access memory is formed on a single chip capable of storing 64K bits. Accordingly, 32 of this chips are interconnected so as to constitute a dynamic RAM having a memory capacity of 250K bytes. Preferably, the dynamic RAM is formed of four separate sections, each section having a 64K byte capacity, and each section being individually selected. In this regard, RAM 20 is provided with four separate section select terminals CAS, and a 2-bit section select signal is utilized to select one of these four separate sections. Still further, and as is conventional for a dynamic RAM, a refresh terminal RAS is provided, this refresh terminal being supplied with a periodic refresh control signal such that the data stored in RAM 20 is refreshed periodically. Those of ordinary skill in the art will recognize that a dynamic random access memory device must be periodically refreshed to maintain the integrity of the data stored therein. If RAM 20 is considered to be formed of columns and rows of selectively addressable storage locations, the dynamic RAM may be refreshed on a column-by-column basis. Refresh circuitry may be formed on the same semiconductor chips as the dynamic RAM itself.

RAM 20 includes data input terminals D and address terminals A. The data terminals are adapted to receive data derived from data bus 2 for writing into an addressed location in the RAM; the addressed location being determined by an address signal supplied to its address terminals A. Depending upon whether data is to be written into or read from the addressed locations, the data stored in RAM 20 also may be read out from data terminals D and supplied to data bus 2.

A buffer register 11 is interconnected between data bus 2 and data terminals D of RAM 20. Buffer register 11 preferably is a bi-directional buffer capable of receiving data from data bus 2 and supplying same to data terminals D for a write-in operation; and for receiving data from data terminals D during a read-out operation, and to supply the read out data to the data bus. Data buffer register 11 also includes an enable terminal G adapted to receive an enable signal which is analogous to the aforementioned chip select signal. Still further, data buffer register 11 includes a direction input adapted to receive a direction control signal to establish the direction in which data passes therethrough. For example, during a write-in operation, the direction control signal controls data buffer register 11 such that data is received from data bus 2 and supplied to data terminals D of RAM 20. During a read-out operation, the direction control signal controls the data buffer register to receive data from data terminals D of RAM 20 and to supply that data to the data bus.

Also illustrated in the drawing are a track address register 12 and a sector address register 13. Track address register 12 is coupled to data bus 2 and is adapted to receive therefrom the track address signal normally generated by or under control of CPU 1. This track address signal is stored in the track address register when the latter is enabled. In this regard, track address register 12 includes an enable terminal CE which is adapted to receive an enable input when the track address signal is provided on data bus 2.

Sector address register 13 may be similar to track address register 12 and is adapted to store therein a sector address signal provided on data bus 2. The sector address register also includes an enable terminal CE which is supplied with an enable signal when the sector address signal is provided on the data bus. Both the track address and sector address registers 12 and 13 include read/write terminals R/W which are connected in common to the direction terminal of data buffer register 11 and are adapted to receive the aforementioned direction control signal. Thus, during a write-in operation, the data buffer register is controlled to transmit data to RAM 20, and the address signals stored in the track and sector address registers are utilized as write-in addresses. Conversely, during a data read-out operation, the data buffer register is controlled to receive data from RAM 20; and the track and sector address registers are similarly controlled to provide read-out addresses.

A counter 16 also is provided, this counter including a clock input CK which is adapted to receive timing, or clock, pulses from a timing control circuit 15. Counter 16 may be a conventional counter whose count is incremented in response to each clock pulse supplied thereto.

A multiplexer 17 is coupled to track address register 12, to sector address register 13 and to counter 16. The multiplexer includes an output coupled to address terminals A of RAM 20. The function of multiplexer 17 is to receive the respective track and sector address signals stored in registers 12 and 13, and also to receive the incrementing count of counter 16 and to synthesize from all of these signals an appropriate RAM address signal. As mentioned above, RAM 20 may be thought of as being formed of rows and columns of storage locations, and multiplexer 17 includes a row/column (R/C) terminal coupled to timing control circuit 15 to receive a row/column selecting signal. In response to a row selecting signal, a portion of the address signals supplied to the multiplexer are coupled thereby to address terminals A of RAM 20 to address. or select, a respective row. In response to a column selecting signal supplied to multiplexer 17, the multiplexer couples the remaining address signals supplied thereto to address terminals A so as to select a corresponding column of storage locations. By alternating between rows and columns, all of the rows of storage locations in successive columns may be addressed, or accessed, for data to be written into or read out therefrom.

Timing control circuit 15 is coupled to oscillator 10 to receive the system clock signals generated thereby. The timing control circuit includes gating and frequency-dividing circuitry to generate the aforementioned timing pulses which are supplied to counter 16 to increment the count thereof. Timing control circuit 15 also includes an output coupled to refresh terminal RAS of dynamic RAM 20 for supplying thereto the aforementioned periodic refresh signals. Still further, the timing control circuit is coupled to track address register 12 to receive at least a portion (e.g. 2) of the bits included in the track address signal, the timing control circuit further operating to decode these bits to produce a section select signal that is supplied to an appropriate one of the section select terminals CAS of RAM 20. Hence, in accordance with the particular embodiment described herein, a respective section of RAM 20 is selected as a function of at least a portion of the track address signal that is stored in track address register 12. It is appreciated that, if two bits of the track address signal are supplied to and decoded by timing control circuit 15, a corresponding one of the four sections of RAM 20 will be selected thereby.

Timing control circuit 15 also includes a read/write (R/W) input coupled to control bus 3 to receive the read/write signal normally generated by, or under control of, CPU 1. The timing control circuit utilizes this read/write control signal to control the direction in which data passes through buffer register 11. Furthermore, the read/write control signal supplied to timing control circuit 15 is utilized thereby to control registers 12 and 13 such that the address signals supplied therefrom to multiplexer 17 are used either as read-out addresses or write-in addresses, respectively.

Also illustrated in the FIGURE is a decoder 14 having, for example, two inputs $A_0A_1$ coupled to address bus 4. Decoder 14 also includes an enable input G coupled to decoder 18 to receive an enable signal which is analogous to the aforementioned chip enable signal produced by decoder 18. Decoder 14 includes four respective outputs, one of which is coupled in common to the enable inputs of buffer register 11 and timing control circuit 15, another of which is coupled to the enable input of track address register 12, a third one of which is coupled to the enable input of sector address register 13, and the last one of which is coupled to the enable input of a status register 21. These outputs of decoder 14 are selectively energized in response to the 2-bit address signal supplied to address terminals $A_0A_1$ from address bus 4. As will be described, the address bits $A_0A_1$ indicate whether the signals provided on data bus 2 are information data signals, track address signals, sector address signals or status signals. The decoder is adapted to decode these address bits to selectively enable either buffer register 11 (and also timing control circuit 15) or track address register 12, or sector address register 13, or status register 21, thereby conditioning the enabled register to communicate with data bus 2.

Status register 21 may be a conventional status register normally utilized with floppy discs and floppy disc controllers.

In the illustrated embodiment, bi-direction data buffer 7 serves to separate, or insulate, CPU 1 from floppy disc 9 and also from the quasi-floppy disc system which includes dynamic RAM 20.

The operation of the quasi-floppy disc system which utilizes RAM 20 now will be described. As mentioned above, a portion of the track address signal stored in track address register 12 is supplied from the track address register to timing control circuit 15 and is used therein to generate a section select signal. Thus, depending upon the contents of these bits, a corresponding section of RAM 20 is selected for access. The remaining bits of the track address signal are supplied to multiplexer 17.

In one embodiment of this invention, all but the least significant bit of the sector address stored in sector address register 13 are supplied to multiplexer 17 and are used therein, in combination with the track address bits, to address a respective column of storage locations included in the selected section of RAM 20. In this embodiment, the least significant bit of the sector address signal, together with the bits which constitute the count generated by counter 16, are supplied to multiplexer 17 and used therein to address respective rows of the selected section of RAM 20. In this embodiment, counter 16 is a 128-step counter and, thus, provides a 7-bit count signal. It is appreciated that, for each track and sector that may be addressed by CPU 1, counter 16 is incremented 128 times so as to store 128 bytes in 128 respective rows of the addressed column in the selected section of RAM 20.

Multiplexer 17 is supplied with the aforementioned row/column control signal from timing control circuit 15. This control signal is a periodic, alternating signal which, during one half cycle, controls the multiplexer to couple the column address signals (comprised of at least portions of the track and sector address signals) to address terminals A of RAM 20. During the other half cycle of the row/column control signal, the incrementing count of counter 16 is supplied by the multiplexer to the address terminals of the RAM, thereby addressing successive rows in the addressed column. In one embodiment, during each complete cycle of the row/column control signal, one column and 128 rows in that column are addressed. Of course, the synthesized address produced by multiplexer 17 is used either as a read-out or write-in address, depending upon the condition, or state, of the read/write control signal supplied to registers 12 and 13 by timing control circuit 15.

As one example, multiplexer 17 supplies an 8-bit column address signal to address terminals A of RAM 20, and also supplies an 8-bit row address signal thereto. The column address signal may be comprised of the three lesser significant bits stored in track address register 12, and the five more significant bits stored in sector address register 13. The two most significant bits stored in the track address register are supplied to timing control circuit 15 for selecting the particular section of RAM 20 which is addressed. The least significant bit stored in sector address register 13, together with the 7-bit of counter 16, comprise the 8-bit row address signal.

In typical operation, when CPU 1 operates, under typical program control, to access a floppy disc store, an address signal is supplied to decoder 18 via address bus 4, whereby the floppy disc system is enabled. Let it be assumed that the quasi-floppy disc system which includes RAM 20 is to be accessed. Accordingly, decoder 18 is supplied with the address signal representing this quasi-floppy disc system; and the decoder supplies an enable signal, such as a chip enable signal, to the enable input G of decoder 14.

Now, and as is normal, a track address signal is provided on data bus 2, and a track identification signal is provided on address bus 4. This track identification signal identifies the information on data bus 2 as being a track address signal. Decoder 14 responds to the track identification signal, which may be contained in bits $A_0A_1$ on address bus 4, to supply an enable signal to the enable input CE of track address register 12. Thus, the track address register is enabled to store the track address signal supplied thereto via data bus 2. Although this track address signal also is supplied to other components, such as to buffer register 11 and to sector address register 13, these other components are not enabled at this time and, therefore, the track address signal is stored only in track address register 12.

Thereafter, and as is also normal, a sector address signal is provided on data bus 2, and a sector identification signal is provided on address bus 4. The sector identification signal, which may be represented by bits $A_0A_1$, is decoded by decoder 14 such that sector address register 13 is enabled. Hence, the sector address signal provided on data bus 2 now is stored in sector address register 13.

If data is to be written into RAM 20, successive data bytes, such as 128 successive bytes, are transmitted from bi-directional buffer 7 on data bus 2. This data is identified as being informational data by a data identification signal provided on address bus 4. Decoder 14 decodes the data identification signal to enable buffer register 11 and, also, to enable timing control circuit 15. The fact that this informational data is to be written into RAM 20 is represented by a write control signal supplied to the timing control circuit via control bus 3. Hence, buffer register 11 is controlled by the direction control signal to transfer data from data bus 2 to the data terminals D of RAM 20. Furthermore, timing control circuit 15 is enabled to select the appropriate section in RAM 20, to supply multiplexer 17 with the appropriate row-/column control signal and to increment the count of counter 16 in response to the system clock pulses which are generated by system clock oscillator 10. Thus, as successive storage locations of RAM 20 are addressed by the incrementing count of counter 16, the successive data bytes supplied to the data terminals D of the RAM are stored in the respectively addressed locations therein. Thus, the data transmitted to RAM 20 via data bus 2 is written into those column and row storage locations which are represented by the track and sector address signals stored in registers 12 and 13, and the incrementing count produced by counter 16. It is recognized that multiplexer 17 supplies the column and row address signals to address terminals A of RAM 20 in time-shared fashion under the control of the row-/column control signal produced by timing control circuit 15.

If data is to be read from RAM 20, the aforedescribed operation is repeated, except that a read control signal is supplied to timing control circuit 15 from control bus 3 so as to control buffer register 11 to receive data from the data terminals D of RAM 20 and to transfer this received data to data bus 2. As before, track and sector address signals are stored in registers 12 and 13, respectively, and when decoder 14 enables timing control circuit 15, counter 16 is incremented, whereby the track and sector address signals, together with the incrementing count, generate successive address signals to access corresponding storage locations in RAM 20. As each storage location is accessed, the data stored therein is read out and transferred via buffer register 11 to data bus 2.

In the preferred embodiment, RAM 20 is a dynamic random access memory which, as is conventional, must be "refreshed" periodically. Timing control circuit 15 may generate periodic refresh signals; and in one embodiment, such refresh signals are inhibited when the timing and control circuit is enabled by decoder 14 to initiate a data write-in or read-out operation. This avoids interference between a data refresh operation and a data write-in or read-out operation.

While the present invention has been particularly shown and described with reference to a preferred embodiment thereof, it will be readily appreciated by those of ordinary skill in the art that various changes and modifications in form and details may be made without departing from the spirit and scope of the invention. For example, counter 16 has been described as being incremented by 128 successive counts when a respective track address signal is stored in register 12 and a respective sector address signal is stored in register 13. This is compatible with conventional floppy disc storage systems whereby 128 bytes of data are stored in each sector in each track on that disc. It will be appreciated that if a greater or lesser number of bytes is stored in a sector, then the count of counter 16 will be adjusted accordingly so as to be incremented by the number of such bytes. Furthermore, multiplexer 17 functions to address RAM 20 in row and column format. If the RAM is addressable by, for example, a single 16-bit address signal, then multiplexer 17 may be omitted and the 16-bit address signal may be constituted by at least some of the bits which constitute the track and sector addresses stored in registers 12 and 13, respectively, and the count of counter 16. Also, and as mentioned above, if RAM 20 is constructed as a static random access memory, the need for a periodic refresh signal will be obviated; and timing control circuit 15 need not generate such a refresh signal.

The foregoing description has explained how RAM 20 is addressed for read and write operations so as to function as a quasi-floppy disc store, thereby enabling normal floppy disc control operations to be carried out therewith. It is intended that the appended claims be interpreted as covering the particularly disclosed system as well as the aforementioned and other changes and modifications therein.

What is claimed is:

1. A semiconductor random access memory (RAM) system for use in a processor system that is operable with a magnetic disc storage device and that normally generates track address signals, sector address signals, read/write control signals and enable signals, said semiconductor RAM system comprising a semiconductor RAM having data input/output means and address means for writing data into or reading data out of a storage location addressed by an address signal supplied to said address means; track address register means for storing a generated track address signal; sector address register means for storing a generated sector address signal; counter means for counting timing pulses to produce a changing count signal; timing control means for generating said timing pulses; and address synthesizing means coupled to said track address register means, said sector address register means and said counter means for synthesizing a RAM address signal from the stored track and sector address signals and the count signal and for supplying said RAM address signal to said RAM address means to access the RAM storage location addressed thereby.

2. The semiconductor RAM system of claim 1 wherein said processor system includes a data bus; and said track and sector address register means are respectively coupled to said data bus.

3. The semiconductor RAM system of claim 2 wherein said processor system further includes a control bus and normally supplies said read/write control signal to said control bus; and said timing control means is connected to receive said read/write control signal and is responsive thereto to selectively control said track and sector address register means to supply the track and sector address signals therein to said address synthesizing means for accessing said RAM.

4. The semiconductor RAM system of claim 2 further comprising buffer register means intercoupled between said data bus and said RAM and selectively operable to transfer data between said data bus and said addressed RAM storage location.

5. The semiconductor RAM system of claim 4 wherein said timing control means is connected to receive said read/write control signal generated by said processor system for applying a direction control signal to said buffer register means; and said buffer register means includes a bidirectional buffer for reading data from and writing data into said addressed RAM storage location in response to said direction control signal.

6. The semiconductor RAM system of claim 1 wherein said processor system selectively generates enable signals; and said semiconductor RAM system includes decoder means for decoding said enable signals and selectively enabling said track and sector address register means to store the generated track and sector address signals.

7. The semiconductor RAM system of claim 6 wherein said decoder means also is operable to selectively enable said timing control means to generate said timing pulses in response to a selectively generated enable signal.

8. The semiconductor RAM system of claim 6 wherein said processor system includes a data bus on which said track and sector address signals are generated; said track and sector address register means being coupled to said data bus and selectively enabled by said decoder means to store the respective track and sector address signals.

9. The semiconductor RAM system of claim 8 further comprising buffer register means intercoupled between said data bus and said RAM, said buffer register means being selectively enabled by said decoder means to transfer data between said data bus and the storage location in said RAM which is being addressed.

10. The semiconductor RAM system of claim 9 wherein said timing control means is connected to receive said read/write control signal generated by said processor system for controlling said track and sector address register means to supply corresponding read and write address signals to said address synthesizing means, and for controlling said buffer register means to correspondingly read data from and write data into the RAM storage location then being addressed.

11. The semiconductor RAM system of claim 9 wherein said processor system further includes an address bus on which said enable signals are generated; and said decoder means is coupled to said address bus.

12. The semiconductor RAM system of claim 11 wherein said processor system further includes means for generating a magnetic disc select signal; and wherein said decoder means is connected to receive and respond to said magnetic disc select signal and thereby be operable to decode said enable signals for selectively enabling said track address, sector address and buffer register means.

13. The semiconductor RAM system of claim 1 wherein said address synthesizing means comprises multiplexer means for multiplexing said stored track and sector addresses with said count signal to produce said RAM address signal.

14. The semiconductor RAM system of claim 13 wherein said RAM storage locations are addressable by column and row; and wherein said multiplexer means produces a column address substantially in response to said stored track and sector address signals, and a row address substantially in response to said count signal.

15. The semiconductor RAM system of claim 14 wherein said timing control means is coupled to said multiplexer means to supply periodic column and row select signals thereto for producing column and row address alternately.

16. The semiconductor RAM system of claim 14 wherein said RAM is a dynamic RAM and wherein said timing control means is coupled to said dynamic RAM to supply periodic refresh signals thereto to enable said dynamic RAM to refresh the contents thereof.

17. The semiconductor RAM system of claim 16 wherein said dynamic RAM is comprised of plural sections; and said timing control means is coupled to said track address register means to produce a section select signal in response to at least a portion of the stored track address signal for selecting a corresponding section of said dynamic RAM to be accessed by said column and row addresses.

* * * * *